(12) United States Patent
Tanaka et al.

(10) Patent No.: US 11,914,246 B2
(45) Date of Patent: Feb. 27, 2024

(54) DISPLAY DEVICE

(71) Applicants: PIONEER CORPORATION, Tokyo (JP); TOHOKU PIONEER CORPORATION, Tendo (JP)

(72) Inventors: Shinsuke Tanaka, Yonezawa (JP); Noriaki Waki, Yonezawa (JP); Katsuhiro Kanauchi, Yonezawa (JP); Hiroki Tan, Tendo (JP)

(73) Assignees: Pioneer Corporation, Tokyo (JP); Tohoku Pioneer Corporation, Tendo (JP)

( * ) Notice: Subject to any disclaimer, the term of this patent is extended or adjusted under 35 U.S.C. 154(b) by 0 days.

(21) Appl. No.: 17/914,726

(22) PCT Filed: Feb. 8, 2021

(86) PCT No.: PCT/JP2021/004527
§ 371 (c)(1),
(2) Date: Sep. 26, 2022

(87) PCT Pub. No.: WO2021/192660
PCT Pub. Date: Sep. 30, 2021

(65) Prior Publication Data
US 2023/0146352 A1    May 11, 2023

(30) Foreign Application Priority Data
Mar. 27, 2020   (JP) .................................. 2020-057520

(51) Int. Cl.
*G02F 1/00* (2006.01)
*G02F 1/13357* (2006.01)
*G02F 1/1335* (2006.01)

(52) U.S. Cl.
CPC .. *G02F 1/133603* (2013.01); *G02F 1/133526* (2013.01); *G02F 1/133621* (2013.01); *G02F 2203/02* (2013.01)

(58) Field of Classification Search
CPC ......... G02F 1/133603; G02F 1/133526; G02F 1/133621; G02F 2203/02
See application file for complete search history.

(56) References Cited

U.S. PATENT DOCUMENTS

| | | | | |
|---|---|---|---|---|
| 5,541,745 A | * | 7/1996 | Fergason | ............ G02F 1/13362 349/5 |
| 2006/0132671 A1 | * | 6/2006 | Koma | ............... G02F 1/133512 349/63 |

(Continued)

FOREIGN PATENT DOCUMENTS

| | | |
|---|---|---|
| JP | 2003307732 A | 10/2003 |
| JP | 2004151576 A | 5/2004 |

(Continued)

OTHER PUBLICATIONS

International Search Report for related Application No. PCT/JP2021/004527, dated Apr. 20, 2021, 1 page.

*Primary Examiner* — Gerald J Sufleta, II
(74) *Attorney, Agent, or Firm* — Procopio, Cory, Hargreaves & Savitch LLP

(57) ABSTRACT

A display device (1) includes a light-emitting device (10), a reflective liquid crystal element (20), and an optical member (30). The light-emitting device (10) includes a plurality of light-emitting units (142) and a light-transmitting unit (144) located between the light-emitting units (142) adjacent to each other. The light-emitting device (10) is located between the reflective liquid crystal element (20) and the optical member (30). The plurality of light-emitting units (142) emit light toward the reflective liquid crystal element (20). The light emitted from the plurality of light-emitting units (142)

(Continued)

is reflected by the reflective liquid crystal element (20), transmitted through the light-emitting unit (142) of the light-emitting device (10), and formed into an image by the optical member (30).

4 Claims, 2 Drawing Sheets

(56)  References Cited

U.S. PATENT DOCUMENTS

| | | | | |
|---|---|---|---|---|
| 2013/0328031 | A1* | 12/2013 | Otsu | H10K 85/324 |
| | | | | 257/40 |
| 2016/0291913 | A1* | 10/2016 | Zou | G02B 27/283 |
| 2019/0250459 | A1* | 8/2019 | Lo | G02F 1/133536 |

FOREIGN PATENT DOCUMENTS

| | | |
|---|---|---|
| JP | 2006154402 A | 6/2006 |
| JP | 2012013992 A | 1/2012 |

\* cited by examiner

DISPLAY DEVICE

CROSS-REFERENCE TO RELATED APPLICATIONS

This application is a U.S. National Stage entry of PCT Application No: PCT/2021/004572 filed Feb. 8, 2021, which claims priority to Japanese Patent Application No. 2020-057520, filed Mar. 27, 2020, the contents of which are incorporated herein by reference.

TECHNICAL FIELD

The present invention relates to a display device.

BACKGROUND ART

A micro organic light-emitting diode (OLED) display module or a Liquid Crystal On Silicon (LCOS) module is sometimes used as a small display device such as an Electronic View Finder (EVF) or a Head Mounted Display (HMD). Further, from viewpoints of reduction of a footprint in an LCOS display module, reduction of a total height, and improvement of a special shape of an optical member such as a half mirror, or the like, a light-emitting device such as OLED may be arranged right above the LCOS.

Patent Document 1 describes a reflective liquid crystal display device. This display device includes the light-emitting device including a light-emitting unit such as an organic electroluminescence element (EL) and a reflective liquid crystal display (LCD). The light-emitting device overlaps the reflective LCD and emits light only toward the reflective LCD side. The light emitted from the light-emitting device is reflected by the reflective LCD and transmitted through a gap of a light shielding layer patterned in a grid shape in the light-emitting device. Thereby, the light which is transmitted through the gap of the light shielding layer patterned in the grid shape is observed by an observer located on the side opposite to the reflective LCD with the light-emitting device therebetween.

RELATED ART DOCUMENT

Patent Document

[Patent Document 1] Japanese Unexamined Patent Application Publication No. 2006-154402

SUMMARY OF THE INVENTION

Technical Problem

From a viewpoint of downsizing a display device or the like, a transmission-type light-emitting device such as an OLED may be arranged right above a reflective liquid crystal element such as LCOS. In this case, even when a configuration in which the light-emitting device emits light not only toward a reflective liquid crystal element side but also toward the side opposite to the reflective liquid crystal display device is adopted, it is not possible to distinguish between light emitted toward a reflective liquid crystal display device side from the light-emitting device and light emitted toward the side opposite to the reflective liquid crystal display device from the light-emitting device. Therefore, such a configuration cannot serve as a display device. On the other hand, as described in Patent Document 1, in a case where the light-emitting device emits light only toward the reflective liquid crystal display device side, for an observer located on the side opposite to the reflective liquid crystal display device with the light-emitting device therebetween, there is a possibility that the visibility of an image displayed by the display device may be affected by a light shielding layer provided in the light-emitting device.

An example of a problem to be solved by the present invention is to make the visibility of an image displayed by a display device high.

Solution to Problem

The invention described in claim 1 is a display device including:
a light-emitting device including a plurality of light-emitting units and a light-transmitting unit located between the light-emitting units adjacent to each other;
a reflective liquid crystal element; and
an optical member,
in which the light-emitting device is located between the reflective liquid crystal element and the optical member,
in which the plurality of light-emitting units emit light toward the reflective liquid crystal element, and
in which the light emitted from the plurality of light-emitting units is reflected by the reflective liquid crystal element, transmitted through the light-transmitting unit of the light-emitting device, and formed into an image by the optical member.

DESCRIPTION OF EMBODIMENTS

Figure 1:
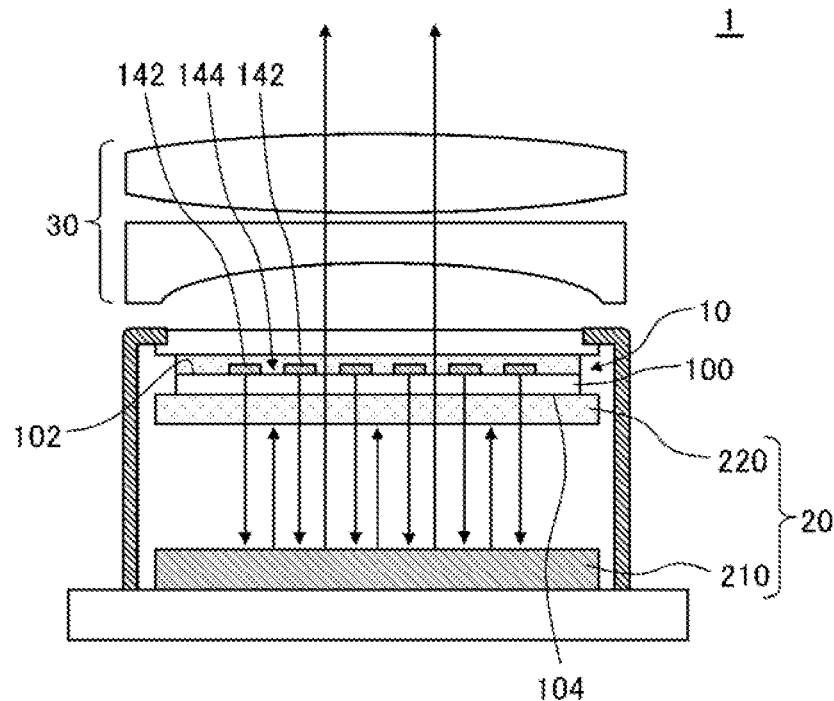
FIG. 1 is a cross-sectional view of a display device according to Embodiment 1.

In the present specification, the expression "A is located over B" may mean that, for example, A is located directly over B without having another element (for example, layer) located between A and B, or may mean that another element (for example, layer) is partly or wholly located between A and B. In addition, expressions indicating a direction such as "top", "bottom", "left", "right", "front", and "rear" or the like are basically used in combination with a direction of a drawing, and it is not limited to be interpreted for, for example, a direction of the use of an invention described in the present specification.

In the present specification, unless otherwise noted, the expression "A and B overlap" means that at least a part of A occupies the same area as at least a part of B in an image projected from a certain direction. At this time, a plurality of elements may be in contact with each other, or may be separated from each other.

In the present specification, unless otherwise noted, the expression "outside of A" means an area on a side where A is not located with an edge of A as a boundary.

In the present specification, an anode indicates an electrode which injects an electron hole into a layer (for example, organic layer) including a light-emitting material, and a cathode indicates an electrode which injects an electron into a layer including the light-emitting material. Further, the expressions "anode" and "cathode" may mean other wordings such as "electron hole injection electrode" and "electron injection electrode", or "positive electrode" and "negative electrode" or the like.

"Light-emitting device" in the present specification includes a device including a light-emitting element, such as a display or illumination. Further, there may be a case where a wiring directly, indirectly, or electrically connected to a light-emitting element, an integrated circuit (IC), or a housing or the like is also included in "light-emitting device".

In the present specification, "connection" indicates a state in which a plurality of elements are being connected regardless of whether they are directly or indirectly connected. For example, a case where the plurality of elements are connected with an adhesive or a connecting member therebetween may also be expressed simply as "a plurality of elements are connected". Further, a case where a member which is capable of supplying or transmitting current, voltage, or electrical potential exists between the plurality of elements and "the plurality of elements are electrically connected" may also be expressed simply as "a plurality of elements are connected".

In the present specification, unless otherwise noted, expressions such as "first, second, A, B, (a), (b)" or the like are intended to distinguish an element, and an essence, an order, a sequence, or a quantity or the like of the element is not limited by the expressions.

In the present specification, each member and each element may be singular, or plural. However, when "singular" or "plural" is clear in a context, it is not limited to this.

In the present specification, unless otherwise noted, a meaning of the expression "A includes B" is not limited to that A is configured only with B, but that A can be configured with elements other than B.

In the present specification, unless otherwise noted, "section" means a surface which appears when the light-emitting device is cut in a direction of a pixel or a light-emitting material or the like being laminated.

In the present specification, expressions such as "does not have", "does not include", and "is not positioned" or the like may mean that a certain element is completely excluded or that a certain element exists to a degree at which the element does not have a technical effect.

In the present specification, expressions for explaining a temporal before-after relationship, such as "after", "subsequently to", "next to", and "before" or the like express a relative temporal relationship, and elements for which the temporal before-after relationship is used are not necessarily continuous. In order to express that elements are continuous, an expression such as "immediately" or "directly" or the like may be used.

Embodiments of the present invention will be described below by referring to the drawings. Moreover, in all the drawings, the same constituent elements are given the same reference numerals, and descriptions thereof will not be repeated.

Embodiment 1

Figure 2:
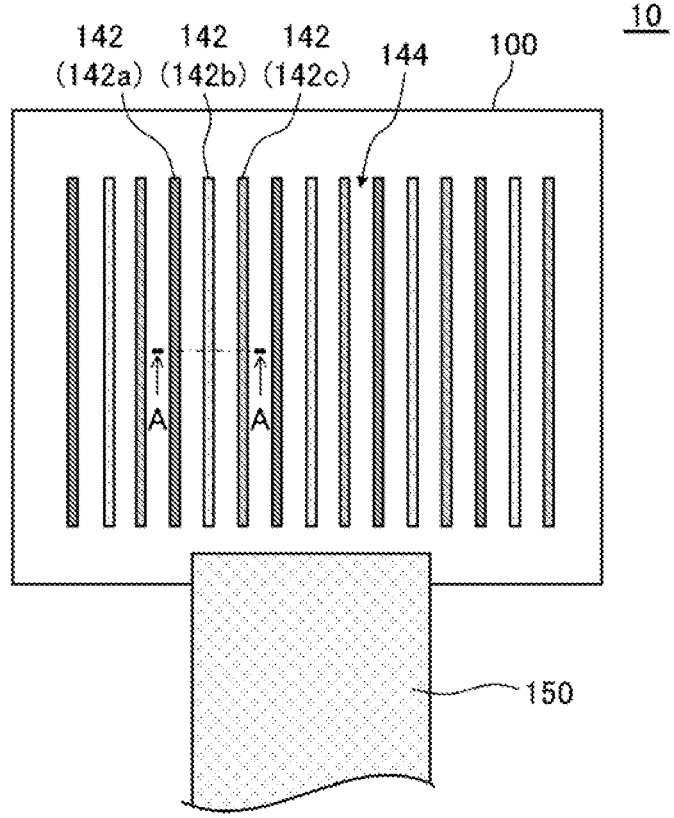
FIG. 2 is a plan view of a light-emitting device of a display device illustrated in FIG. 1.
Figure 3:
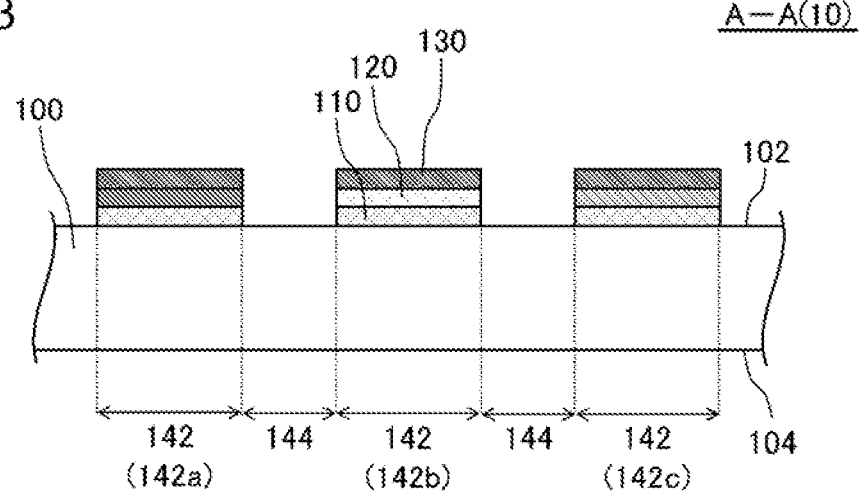
FIG. 3 is a cross-sectional view taken along line A-A of FIG. 2.

FIG. 1 is a cross-sectional view of a display device 1 according to Embodiment 1. FIG. 2 is a plan view of a light-emitting device 10 of the display device 1 illustrated in FIG. 1. FIG. 3 is a cross-sectional view taken along line A-A of FIG. 2. FIG. 1 illustrates one cross section perpendicular to a height direction of the display device 1.

The display device 1 includes the light-emitting device 10, a reflective liquid crystal element 20, and an optical member 30. The light-emitting device 10 includes a substrate 100, a plurality of light-emitting units 142, and a plurality of light-transmitting units 144. Each light-emitting unit 142 includes an organic EL element. Each light-transmitting unit 144 is located between the light-emitting units 142 adjacent to each other. The reflective liquid crystal element 20 includes a spatial light modulation element 210 and a polarizer 220 (polarizing plate).

In FIG. 1, an arrow extending from the light-emitting unit 142 toward the spatial light modulation element 210 represents light emitted from the light-emitting unit 142. Further, an arrow extending from the spatial light modulation element 210 toward the polarizer 220 represents light reflected by the spatial light modulation element 210 and shielded by the polarizer 220. Further, an arrow which extends from the spatial light modulation element 210 passing through the polarizer 220, the substrate 100, and the optical member 30 represents light which is reflected by the spatial light modulation element 210 and is transmitted through the polarizer 220, the substrate 100, and the optical member 30.

The display device 1 will be explained by referring to FIGS. 1 to 3.

The light-emitting device 10 is located between the reflective liquid crystal element 20 and the optical member 30.

The substrate 100 includes a first surface 102 and a second surface 104. The plurality of light-emitting units 142 are located over the first surface 102 of the substrate 100. It is possible to supply driving power to the plurality of light-emitting units 142 from the outside of the light-emitting device 10 through a wiring member 150 such as a Flexible Printed Circuit (FPC) or the like. The second surface 104 is on the opposite side to the first surface 102.

As shown in FIG. 3, each light-emitting unit 142 includes a first electrode 110, an organic layer 120, and a second electrode 130. The first electrode 110, the organic layer 120, and the second electrode 130 are stacked in order from the first surface 102 side of the substrate 100.

The substrate 100 may be single-layered or multi-layered. The substrate 100 is, for example, a glass substrate. The substrate 100 may be a resin substrate including an organic material (for example, polyethylene naphthalate (PEN), polyether sulphone (PES), polyethylene terephthalate (PET), or polyimide). When the substrate 100 is a resin substrate, an inorganic barrier layer (for example, SiN or SiON) may be positioned over at least one of the first surface 102 and the second surface 104 of the substrate 100.

In the present embodiment, the light-emitting device 10 emits light from the second surface 104 side of the substrate 100. That is, the light-emitting device 10 has a bottom-emission structure. In this case, the substrate 100 has light-transmitting properties. Transmittance of visible light of the substrate 100 is, for example, equal to or greater than 75% and equal to or less than 100%.

The first electrode 110 has light-transmitting properties. Transmittance of visible light of the first electrode 110 is, for example, equal to or greater than 75% and equal to or less than 100%. The first electrode 110 can function as an anode. In one example, the first electrode 110 includes a metal or an alloy. The metal or the alloy is, for example, silver or a silver alloy. In this example, the thickness of the first electrode 110 may be, for example, equal to or greater than 5 nm and equal to or less than 50 nm. When the thickness of the first electrode 110 is equal to or greater than the lower limit, it is possible to lower electric resistance of the first electrode 110, and when the thickness of the first electrode 110 is equal to or less than the upper limit, it is possible to increase transmittance of the first electrode 110. In another example, the first electrode 110 may include an oxide semiconductor. The oxide semiconductor is, for example, Indium Tin Oxide (ITO), Indium Zinc Oxide (IZO), Indium Tungsten Zinc Oxide (IWZO), Zinc Oxide (ZnO), or Indium Gallium Zinc Oxide (IGZO).

The organic layer 120 is located over the first electrode 110. The organic layer 120 may include, for example, a hole injection layer (HIL), a hole transport layer (HTL), a light-emitting layer (EML), an electron transport layer (ETL), and an electron injection layer (EIL) in this order from the first electrode 110 toward the second electrode 130. However, an example of a layer included in respective organic layers 120 is not limited to the example explained here.

The second electrode 130 has light shielding properties, specifically, light reflectivity. Transmittance of visible light of the second electrode 130 is, for example, equal to or greater than 0% and equal to or less than 20%. The second electrode 130 is located over the organic layer 120. The second electrode 130 can function as a cathode. In one example, the second electrode 130 may include a metal or an alloy. The metal or the alloy is, for example, at least one metal selected from a group formed of Al, Au, Ag, Pt, Mg, Sn, Zn, and In, or an alloy of a metal selected from this group.

In the present embodiment, the plurality of light-emitting units 142 are arranged in a stripe pattern. A light shielding member such as the second electrode 130 is not positioned in a region between light-emitting units 142 adjacent to each other. Therefore, the region between the light-emitting units 142 adjacent to each other is a light-transmitting unit 144. Transmittance of visible light of the light-transmitting unit 144 is, for example, equal to or greater than 40% and equal to or less than 100%.

Further, the plurality of light-emitting units 142 include a plurality of R (red) light sources 142a, a plurality of G (green) light sources 142b, and a plurality of B (blue) light sources 142c. Each R light source 142a, each G light source 142b, and each B light source 142c is repeatedly arranged along a direction intersecting the extending direction of the stripe. However, the R light sources 142a, the G light sources 142b, and the B light sources 142c may have a dot shape arranged in a matrix. In a case where the plurality of light-emitting units 142 include the R light source 142a, the G light source 142b, and the B light source 142c, the display device 1 can display a color image by a field sequential color (FSC) method of the spatial light modulation element 210.

The plurality of light-emitting units 142 emit light toward the reflective liquid crystal element 20. Specifically, the light-emitting device 10 emits the light to the second surface 104 side, the second surface being one surface of both surfaces of the light-emitting device 10, and substantially does not emit the light to a first surface 102 side, the first surface being the other surface of the both surfaces of the light-emitting device 10. This is due to that almost all or an entirety of the light emitted from the organic layer 120 is reflected by the second electrode 130 having the light reflectivity and is not transmitted through the second electrode 130. For example, the maximum luminous intensity on the first surface 102 side of the light-emitting device 10 is equal to or greater than 0% and equal to or less than 10% of the maximum luminous intensity on the second surface 104 side of the light-emitting device 10.

The spatial light modulation element 210 includes liquid crystal, for example, LCOS.

Light emitted from the light-emitting device 10 is transmitted through the polarizer 220. The light transmitted through the polarizer 220 becomes linearly polarized light. This linearly polarized light is incident on the spatial light modulation element 210 and rotates depending on a pixel of the spatial light modulation element 210. The linearly polarized light rotated and reflected by the spatial light modulation element 210 is shielded by the polarizer 220. In contrast, the linearly polarized light which is reflected without being rotated by the spatial light modulation element 210 is transmitted through the polarizer 220.

The optical member 30 is a condensing element. In the present embodiment, the optical member 30 includes at least one lens. Light emitted from the plurality of light-emitting units 142 is reflected by the reflective liquid crystal element 20, transmitted through the light-transmitting unit 144 of the light-emitting device 10 and the optical member 30, and emitted. That is, the light emitted from the plurality of light-emitting units 142 is reflected by the reflective liquid crystal element 20, transmitted through the light-transmitting unit 144 of the light-emitting device 10, and formed into an image by the optical member 30. Note that the optical member 30 may include, for example, a diffraction grating instead of the lens.

The reflective liquid crystal element 20 is located within a depth of field of the optical member 30. In contrast, the light-emitting unit 142 of the light-emitting device 10, more specifically, the second electrode 130 is located outside the depth of field of the optical member 30. Therefore, in the present embodiment, when an observer observes an image displayed by the display device 1 from the above of the display device 1, the second electrode 130 looks blurred. Therefore, it is possible to make the second electrode 130 unnoticeable to the observer of the image of the light-emitting device 10. That is, in the present embodiment, in comparison with a case where the optical member 30 is not provided, it is possible to make the visibility of an image displayed by the display device 1 high.

Embodiment 2

Figure 4:
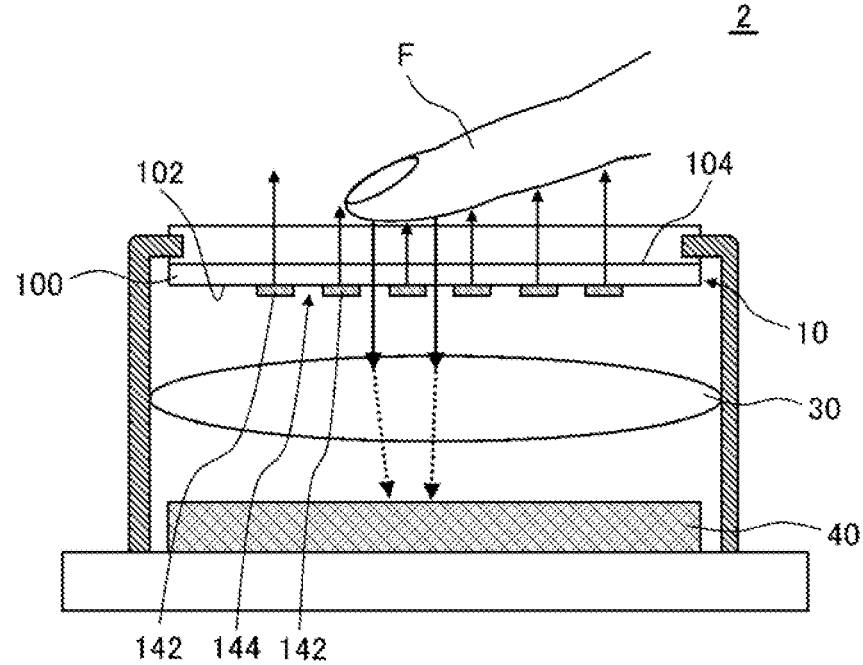
FIG. 4 is a cross-sectional view of a detection device according to Embodiment 2.

FIG. 4 is a cross-sectional view of a detection device 2 according to Embodiment 2. FIG. 4 illustrates one cross section perpendicular to a height direction of the detection device 2.

The detection device 2 includes a light-emitting device 10, an optical member 30, and an imaging element 40. In the present embodiment, the detection device 2 detects a fingerprint of a finger F as an object. However, the object which can be detected by the detection device 2 is not limited to the example according to the present embodiment.

In FIG. 4, an arrow extending from a light-emitting unit 142 toward a side on which the finger F is located represents light emitted from the light-emitting unit 142. In addition, an arrow extending from the finger F toward a side on which the light-emitting device 10, the optical member 30, and the imaging element 40 are located represents light reflected by the finger F.

A summary of the detection device 2 is explained using FIG. 4. The optical member 30 is located between the light-emitting device 10 and the imaging element 40. A plurality of light-emitting units 142 emit light toward a side opposite to a side on which the optical member 30 is located. The light emitted from the plurality of light-emitting units 142 is reflected by the finger F, transmitted through the light-transmitting unit 144 of the light-emitting device 10, and formed into an image on the imaging element 40 by the optical member 30. Thereby, the fingerprint of the finger F is detected.

As is the case with Embodiment 1, the light-emitting device 10 includes a substrate 100, the plurality of light-emitting units 142, and a plurality of light-transmitting units 144. The plurality of light-emitting units 142 are, for example, monochrome light sources. The light-emitting device 10 has a bottom-emission structure. The plurality of light-emitting units 142 of the light-emitting device 10 emit light toward a side opposite to a side on which the optical member 30 and the imaging element 40 are located. In other words, the light-emitting device 10 is arranged such that a first surface 102 of the substrate 100 faces the optical member 30 and the imaging element 40.

The optical member 30 is a condensing element, and includes at least one lens. In the present embodiment, the optical member 30 includes a focus lens.

The imaging element 40 is an image sensor, such as, for example, a Complementary MOS (CMOS) image sensor, a Charge-Coupled Device (CCD) image sensor.

In the present embodiment, the imaging element 40, the optical member 30, and the light-emitting device 10 are stacked along one direction, specifically, a height direction of the detection device 2. In this case, for example, in comparison with a case where a light source to irradiate light to the finger F and a sensor which detects light reflected by the finger F are aligned in a direction perpendicular to the height direction of the detection device 2, a size of the detection device 2 in the direction perpendicular to the height direction of the detection device 2 can be reduced.

As described above, although the embodiments of the present invention have been set forth with reference to the accompanying drawings, they are merely illustrative of the present invention, and various configurations other than those stated above can be adopted.

For example, in respective embodiments, the light-emitting device 10 has a bottom-emission structure. However, the light-emitting device 10 may has a top-emission structure.

Further, in Embodiment 1, the plurality of light-emitting units 142 include light sources of different colors. However, the plurality of light-emitting units 142 may be the monochrome light sources. Even in such a case, the display device 1 can display a monochrome image.

Further, in respective embodiments, the light-emitting unit 142 includes an organic EL element. However, the light-emitting unit 142 may include a light-emitting element which is different from the organic EL element, such as an inorganic EL element or the like.

According to Embodiment 1, following aspects are provided.

(Aspect 1-1)
A display device including:
a light-emitting device including a plurality of light-emitting units and a light-transmitting unit located between the light-emitting units adjacent to each other;
a reflective liquid crystal element; and
an optical member,
in which the light-emitting device is located between the reflective liquid crystal element and the optical member,
in which the plurality of light-emitting units emit light toward the reflective liquid crystal element, and
in which the light emitted from the plurality of light-emitting units is reflected by the reflective liquid crystal element, transmitted through the light-transmitting unit of the light-emitting device, and formed into an image by the optical member.

(Aspect 1-2)
The display device according to aspect 1-1,
in which the optical member includes a lens.

(Aspect 1-3)
The display device according to aspect 1-1 or 1-2,
in which the reflective liquid crystal element is located within a depth of field of the optical member, and
in which the plurality of light-emitting units of the light-emitting device are located outside the depth of field of the optical member.

(Aspect 1-4)
The display device according to any one of aspects 1-1 to 1-3,
in which each of the plurality of light-emitting units includes an organic EL element.

(Aspect 1-5)
The display device according to any one of aspects 1-1 to 1-4,
in which the plurality of light-emitting units include a R light source, a G light source, and a B light source.

(Aspect 1-6)
A display device including:
a light-emitting device including a plurality of light-emitting units and a light-transmitting unit located between the light-emitting units adjacent to each other;
a reflective liquid crystal element; and
a condensing element,
in which the light-emitting device is located between the reflective liquid crystal element and the condensing element,
in which the plurality of light-emitting units emit light toward the reflective liquid crystal element, and
in which the light emitted from the plurality of light-emitting units is reflected by the reflective liquid crystal element, transmitted through the light-transmitting unit of the light-emitting device and the condensing element, and emitted.

(Aspect 1-7)
The display device according to aspect 1-6,
in which the condensing element includes a lens.

(Aspect 1-8)
The display device according to aspect 1-6 or 1-7,
in which the reflective liquid crystal element is located within a depth of field of the condensing element, and
in which the plurality of light-emitting units of the light-emitting device are located outside the depth of field of the condensing element.

(Aspect 1-9)
The display device according to any one of aspects 1-6 to 1-8,
in which each of the plurality of light-emitting units includes an organic EL element.

(Aspect 1-10)
The display device according to any one of aspects 1-6 to 1-9,
in which the plurality of light-emitting units include a R light source, a G light source, and a B light source.

According to Embodiment 2, following aspects are provided.

(Aspect 2-1)
A detection device detecting an object, the detection device including:

a light-emitting device including a plurality of light-emitting units and a light-transmitting unit located between the light-emitting units adjacent to each other;

an imaging element; and an optical member, in which the optical member is located between the light-emitting device and the imaging element, in which the plurality of light-emitting units emit light toward a side opposite to a side on which the optical member is located, and in which the light emitted from the plurality of light-emitting units is reflected by the object, transmitted through a plurality of transmission units of the light-emitting device, and formed into an image on the imaging element by the optical member.

(Aspect 2-2)

The detection device according to aspect 2-1, in which the optical member includes a lens.

(Aspect 2-3)

The detection device according to aspect 2-1 or 2-2, in which each of the plurality of light-emitting units includes an organic EL element.

(Aspect 2-4)

The detection device according to any one of aspects 2-1 to 2-3, in which the plurality of light-emitting units are monochrome light sources.

This application claims priority from Japanese Patent Application No. 2020-057520, filed on Mar. 27, 2020, the disclosure of which is incorporated by reference in its entirety.

REFERENCE SIGNS LIST 1 display device
2 detection device
10 light-emitting device
20 reflective liquid crystal element
30 optical member
40 imaging element
100 substrate
102 first surface
104 second surface
110 first electrode
120 organic layer
130 second electrode
142 light-emitting unit
142a R light source
142b G light source
142c B light source
144 light-transmitting unit
150 wiring member
210 spatial light modulation element
220 polarizer

The invention claimed is:

1. A display device comprising:
a light-emitting device comprising a plurality of light-emitting units and a light-transmitting unit located between the light-emitting units adjacent to each other;
a reflective liquid crystal element; and
an optical member,
wherein the light-emitting device is located between the reflective liquid crystal element and the optical member,
wherein the plurality of light-emitting units emit light toward the reflective liquid crystal element,
wherein the light emitted from the plurality of light-emitting units is reflected by the reflective liquid crystal element, transmitted through the light-transmitting unit of the light-emitting device, and formed into an image by the optical member,
wherein the reflective liquid crystal element is located within a depth of field of the optical member, and
wherein the plurality of light-emitting units of the light-emitting device are located outside the depth of field of the optical member.

2. The display device according to claim 1, wherein the optical member comprises a lens.

3. The display device according to claim 1, wherein each of the plurality of light-emitting units comprises an organic electroluminescence (EL) element.

4. The display device according to claim 1, wherein the plurality of light-emitting units comprise an R light source, a G light source, and a B light source.

* * * * *